(12) United States Patent
Schupp et al.

(10) Patent No.: US 10,247,326 B2
(45) Date of Patent: Apr. 2, 2019

(54) LINEAR VALVE DRIVE AND VALVE

(71) Applicant: Buerkert Werke GmbH & Co., Ingelfingen (DE)

(72) Inventors: Michael Schupp, Karlsruhe (DE); Jan Westermann, Karlsruhe (DE)

(73) Assignee: BUERKERT WERKE GMBH & CO. KG, Ingelfingen (DE)

( * ) Notice: Subject to any disclaimer, the term of this patent is extended or adjusted under 35 U.S.C. 154(b) by 0 days.

(21) Appl. No.: 15/638,498

(22) Filed: Jun. 30, 2017

(65) Prior Publication Data

US 2018/0003312 A1  Jan. 4, 2018

(30) Foreign Application Priority Data

Jul. 1, 2016 (DE) .................. 10 2016 112 115

(51) Int. Cl.
*F16K 31/00* (2006.01)
*H01L 41/23* (2013.01)
(Continued)

(52) U.S. Cl.
CPC .......... *F16K 31/004* (2013.01); *F16K 31/007* (2013.01); *F16K 31/008* (2013.01); *G05D 7/0635* (2013.01); *H01L 41/23* (2013.01); *H01L 41/053* (2013.01); *H01L 41/083* (2013.01); *Y10T 137/7761* (2015.04)

(58) Field of Classification Search
CPC .... F16K 31/004; F16K 31/007; F16K 31/008; F16K 27/041; F16K 27/048; F16K 7/14; F16K 31/02; Y10T 137/7761; H01L 41/23; H01L 41/083; H01L 41/053; G05D 7/0635

See application file for complete search history.

(56) References Cited

U.S. PATENT DOCUMENTS 4,008,876 A * 2/1977 Bastle ................ F16K 31/0655
                                                        251/129.19
5,100,100 A * 3/1992 Benson ................ F16K 31/007
                                                        137/486

(Continued)

FOREIGN PATENT DOCUMENTS

DE   102010027518 A1   1/2012
JP   H10275018 A      10/1998
JP   H11173440 A       6/1999

OTHER PUBLICATIONS

German Search Report dated Mar. 28, 2017 in the German Patent Application No. 10 2016 112 115.0.

*Primary Examiner* — Matthew W Jellett

(74) *Attorney, Agent, or Firm* — Dilworth IP, LLC

(57) ABSTRACT

A linear valve drive for connection to a valve body which has a valve seat is described, wherein said linear valve drive comprises a drive housing, a valve closure element and a piezoelectric actuator which is arranged within said drive housing. Said valve closure element is displaceable in the axial direction between an open position and a closed position by means of said piezoelectric actuator and an interposed actuating device. Said piezoelectric actuator is supported on said actuating device via its side directed towards the valve closure element. Said linear valve drive comprises an adjusting device which is configured such that an idle stroke of said linear valve drive is adjustable. A valve is also described.

20 Claims, 5 Drawing Sheets

(51) Int. Cl.
*G05D 7/06* (2006.01)
*H01L 41/083* (2006.01)
*H01L 41/053* (2006.01)

(56) References Cited

U.S. PATENT DOCUMENTS

| | | | | |
|---|---|---|---|---|
| 5,145,147 | A * | 9/1992 | Nakazawa | F16K 31/007 251/11 |
| 6,394,415 | B1 | 5/2002 | Ohmi et al. | |
| 8,181,932 | B2 * | 5/2012 | Matsumoto | F16K 7/14 251/129.02 |
| 8,191,856 | B2 * | 6/2012 | Matsumoto | F16K 7/14 251/129.02 |
| 9,163,743 | B2 * | 10/2015 | Hidaka | F16K 7/14 |
| 9,625,047 | B2 * | 4/2017 | Hirose | F16K 7/14 |
| 2016/0363231 | A1 * | 12/2016 | Yasumoto | F16K 7/14 |

* cited by examiner

LINEAR VALVE DRIVE AND VALVE

FIELD OF THE INVENTION

Embodiments of the present disclosure relate to a linear valve drive for connection to a valve body, which has a valve seat, and to a valve, in particular a valve which is closed without current, i.e. a normally closed valve (NC valve).

BACKGROUND OF THE INVENTION

Prior art valves for controlling or regulating fluids are known, which include a valve body and a linear valve drive formed separately from the valve body. The linear valve drive and the valve body are connected to one another in order to form the valve.

The linear valve drive has a drive unit, e.g. a piezoelectric actuator. The drive unit can displace a valve closure element by means of an actuating device, which is provided in the linear valve drive, or an actuating mechanism. For instance, the linear valve drive can move the valve closure element at least to an open and/or a closed position in which the valve closure element lies on a valve seat formed in the valve body and seals said valve seat so that no fluid can flow through the valve.

Furthermore, it is known from the prior art that an adjusting device or an adjusting option can be provided, by means of which a change in length in the linear valve drive can be compensated for, in particular the actuating device. The change in length is brought about by temperature changes or service life effects, e.g. setting effects.

A specific material pairing can be used in the actuating device, which can compensate for changes in length induced at least by temperature. However, it is not thereby possible to compensate for any service life effects which occur.

According to one further possibility, a voltage is applied if the drive unit is a piezoelectric actuator. As a result, a change in length in the linear valve drive is actively produced, in particular a change in length of the piezoelectric actuator, so that in terms of valve control technology, said actuator has a changed length in the initial state. The actively adjusted change in length compensates for the changes in length produced by temperature changes or service life effects.

A further possibility which is known from the prior art is to provide clearance or an idle stroke which can be utilized in order to react to any occurring changes in length of the actuating device and to compensate for same. An idle (no-load) stroke is the particular displacement path of the actuating device or the actuating mechanism in the linear valve drive which is not converted into an axial movement of the valve closure element because initially the clearance present in the actuating device or the actuating mechanism must be overcome.

DE 10 2010 027 518 A1 discloses e.g. an NC valve, i.e. a normally closed valve, which has an adjustable idle stroke which can be adjusted by means of an externally arranged tensioning element. The force originating from the actuator is transmitted to the valve closure element via a mechanism provided in the linear valve drive, wherein the actuating mechanism comprises inter alia lever devices, i.e. deflecting mechanisms.

JP-H11-173 440 A describes a valve arrangement in which a clearance in the form of a gap which occurs during assembly of the valve arrangement is to be compensated for once so that it is no longer present. This is necessary in that case to ensure that a piezo stack which is provided in the valve arrangement remains under the required pre-loading, in that the piezo stack lies via a collar against a union nut directly, i.e. without any clearance.

SUMMARY OF THE INVENTION

The object of the present disclosure is inter alia to provide a linear valve drive and a valve which are constructed in a simple manner and by means of which an idle stroke can be adjusted.

The object is achieved inter alia by means of a linear valve drive for connection to a valve body which has a valve seat, wherein the linear valve drive comprises a drive housing, a valve closure element and a piezoelectric actuator which is arranged within the drive housing, wherein the valve closure element can be displaced in the axial direction between an open position and a closed position by means of the piezoelectric actuator and an interposed actuating device, wherein the piezoelectric actuator is supported on the actuating device via its side directed towards the valve closure element, and wherein the linear valve drive comprises an adjusting device which is configured such that an idle stroke of the linear valve drive can be adjusted.

The basic idea is to simplify the mechanical structure of the linear valve drive for the NC valve, in that the piezoelectric actuator is supported on the side of the actuating device directed towards the valve closure element. This provides a bearing for the piezoelectric actuator at the lower end of the piezoelectric actuator, i.e. on the side directed towards the valve closure element. The other end of the piezoelectric actuator is thus a free end which is displaced in a corresponding manner axially, and in particular away from the valve closure element, when the voltage of the piezoelectric actuator is changed. The actuating mechanism or actuating device can be arranged in a simple manner at this free end of the piezoelectric actuator, said mechanism or device then transmitting a pulling force to the valve closure element if the piezoelectric actuator expands. The actuating device of the linear valve drive which is required in order to transmit the force originating from the piezoelectric actuator to the valve closure element is simplified accordingly. A complicated lever effect which is provided in the actuating mechanism or actuating device and which reverses the direction of force can be omitted. The idle stroke can be adjusted in particular only once during assembly of the valve.

In general, an idle (no-load) stroke is to be understood to be a stroke path of the linear valve drive which is greater than zero, wherein the valve closure element is not yet actuated during the idle stroke. Accordingly, this idle stroke also occurs in the closed position of the linear valve drive of the NC valve in which the valve closure element is likewise in its closed position.

The adjusting device also ensures that the idle stroke can be adjusted in the actuating device, thus making it possible to react to changes in length in the actuating mechanism of the linear valve drive which are not to be prevented and which are produced e.g. by reason of service life effects or temperature effects. The idle stroke is adapted accordingly to the occurring changes in length so that they can be compensated for and have no influence upon the opening and closing behavior of the linear valve drive.

Therefore, the idle stroke which is greater than zero can be adjusted variably, wherein it can also always be adapted to changes in the linear valve drive. Therefore, this specifically does not relate to the one-time compensation of a clearance, which occurs during assembly, in order to prevent the clearance accordingly. In contrast, an idle stroke is intentionally introduced and adjusted, i.e. a stroke path greater than zero which is not yet actuated in the valve closure element.

In one aspect, provision is made that the actuating device comprises an entrainment element and a pulling piece, in particular wherein a clearance between the entrainment element and the pulling piece can be adjusted by the adjusting device, said clearance corresponding to the idle stroke. The actuating device is thus formed in multiple parts, wherein two parts are provided which are not rigidly connected to one another. The entrainment element and the pulling piece are thus generally movable relative to one another. The adjusting device cooperates accordingly with the actuating device in order to change the clearance provided between the entrainment element and the pulling piece, if this is required.

The entrainment element is coupled preferably to the piezoelectric actuator and entrains the pulling piece if the piezoelectric actuator transmits a pulling force to the entrainment element, i.e. a force directed away from the valve closure element. The pulling piece is coupled, in turn, to the valve closure element and then pulls said element out of its closed position in the direction of the open position.

According to a further aspect, the adjusting device comprises an axially displaceable pulling sleeve which at least partially surrounds the piezoelectric actuator and is part of the actuating device, in particular is fixedly coupled to the entrainment element of the actuating device. The piezoelectric actuator is additionally mechanically protected by the pulling sleeve in the linear valve drive. Furthermore, the concentric arrangement ensures that the forces originating from the piezoelectric actuator are transmitted in a homogeneous manner via the pulling sleeve.

The pulling sleeve is both part of the adjusting device and part of the actuating device. Accordingly, a change provided at the adjusting device is transmitted to the entrainment element via the pulling sleeve so that the clearance between the entrainment element and the pulling piece is changed, which results in a change or adjustment of the idle stroke of the linear valve drive.

The entrainment element and the pulling sleeve can be formed together in one piece so that a pulling entrainment sleeve is formed which is coupled to the free end of the piezoelectric actuator and cooperates directly with the pulling piece.

The pulling sleeve is also coupled to an axial end of the piezoelectric actuator, in particular to the end of the piezoelectric actuator facing away from the valve closure element. This is the non-fixed end of the piezoelectric actuator, via which a change in length is transmitted if the piezoelectric actuator is activated accordingly. This axial end can also be designated as the free end of the piezoelectric actuator.

In the event of a change in the length of the piezoelectric actuator, the pulling sleeve is displaced and acts upon the entrainment element of the actuating device, whereby, in turn, the valve closure element is displaced. If the piezoelectric actuator changes its length by reason of a corresponding activation, the pulling sleeve coupled to the actuator thus also moves. The pulling sleeve pulls on the entrainment element which is coupled to pulling sleeve and which entrains the pulling piece if the clearance which is provided and adjustable between the entrainment element and the pulling sleeve, i.e. the idle stroke, has been overcome.

According to a preferred embodiment, the actuating device has a bearing element which is directly coupled to the piezoelectric actuator and on which the piezoelectric actuator is supported, in particular wherein the bearing element is fixedly mounted in the drive housing. The bearing element thus constitutes the bearing of the piezoelectric actuator in the linear valve drive, by means of which the piezoelectric actuator can be supported with its fixed end or bearing end. Since the bearing element is fixedly mounted in the drive housing, it is ensured that the piezoelectric actuator is mounted fixedly in relation to the linear valve drive on this side.

In particular, the pulling sleeve has at least one aperture, through which the bearing element extends. This ensures that the pulling sleeve can be displaced in the axial direction if e.g. the idle stroke or the clearance is changed or the valve in general is displaced to another position. The pulling sleeve can also have two separate apertures, through which corresponding limbs of the bearing element extend in order to be supported on the drive housing.

In a further aspect, provision is made that the actuating device comprises a spring system, by means of which the piezoelectric actuator is pre-loaded, in particular wherein the spring system is supported with one side on the bearing element, preferably on the side of the bearing element opposite the piezoelectric actuator. The spring system urges the entrainment element in the direction of the valve closure element, whereby the pulling sleeve coupled to the entrainment element is pulled in the direction of the valve closure element. The pulling sleeve thereby pre-loads the free axial end of the piezoelectric actuator because the free axial end of the piezoelectric actuator is urged by the pulling sleeve in the direction of the valve closure element.

Furthermore, a closing spring can be provided which is supported on the drive housing and urges the valve closure element away from the piezoelectric actuator so that, when a valve body is connected, the valve closure element is urged onto the valve seat if no voltage is applied to the piezoelectric actuator. The NC valve is formed in this manner.

In particular, the piezoelectric actuator does not transmit any force to the valve closure element in the closed position. Accordingly, the linear valve drive is a drive for an NC valve because in the closed position no forces originate from the piezoelectric actuator. Only when the valve closure element is displaced from the closed position in the direction of the open position, a force is transmitted via the piezoelectric actuator, which displaces the valve closure element from the closed position.

The valve closure element can comprise a sealing portion and a diaphragm portion which, in particular, are formed together in one piece. The sealing portion serves to seal an inflow channel or an outflow channel in the valve body if the linear valve drive is coupled to the valve body in order to form the valve. The at least one diaphragm portion ensures that further flow spaces, such as a collecting space, are correspondingly sealed.

The object is also achieved by a valve, in particular an NC valve, which has a valve drive of the aforementioned type. The corresponding advantages of the linear valve drive which have been mentioned above apply in a similar manner to the valve.

In particular, the valve has a valve body which comprises at least one inflow channel, at least one outflow channel and/or at least one collecting space. The corresponding channels and spaces are sealed in the closed position by means of the valve closure element. For this purpose, the valve closure element correspondingly has the sealing portion and/or the diaphragm portion.

BRIEF DESCRIPTION OF THE DRAWINGS

Further advantages and properties of the present disclosure will be apparent from the following description and the drawings to which reference is made. In the drawings.

DETAILED DESCRIPTION OF THE INVENTION

Figure 1:
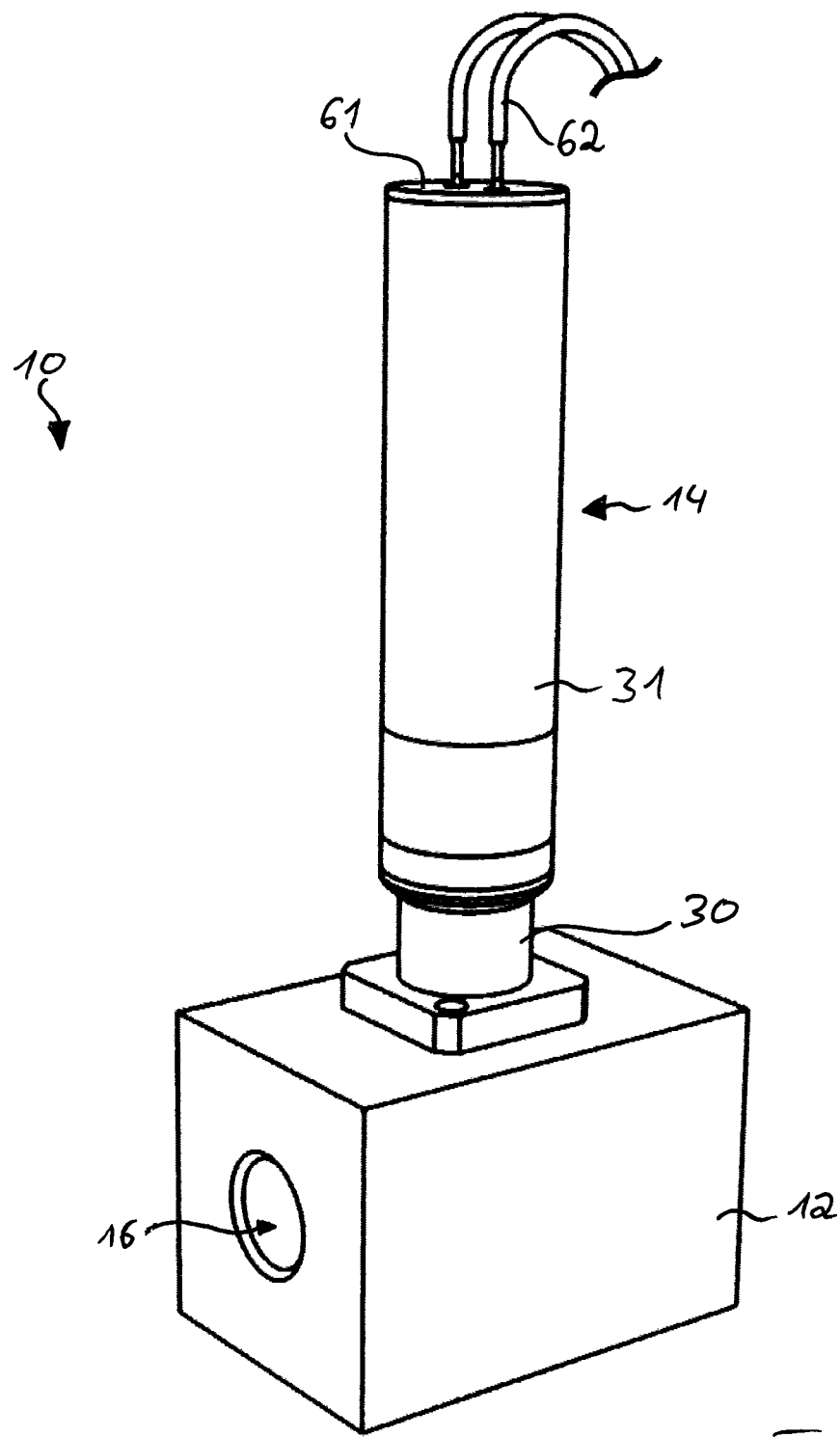
FIG. 1 shows a perspective view of a valve in accordance with the present disclosure.
Figure 2:
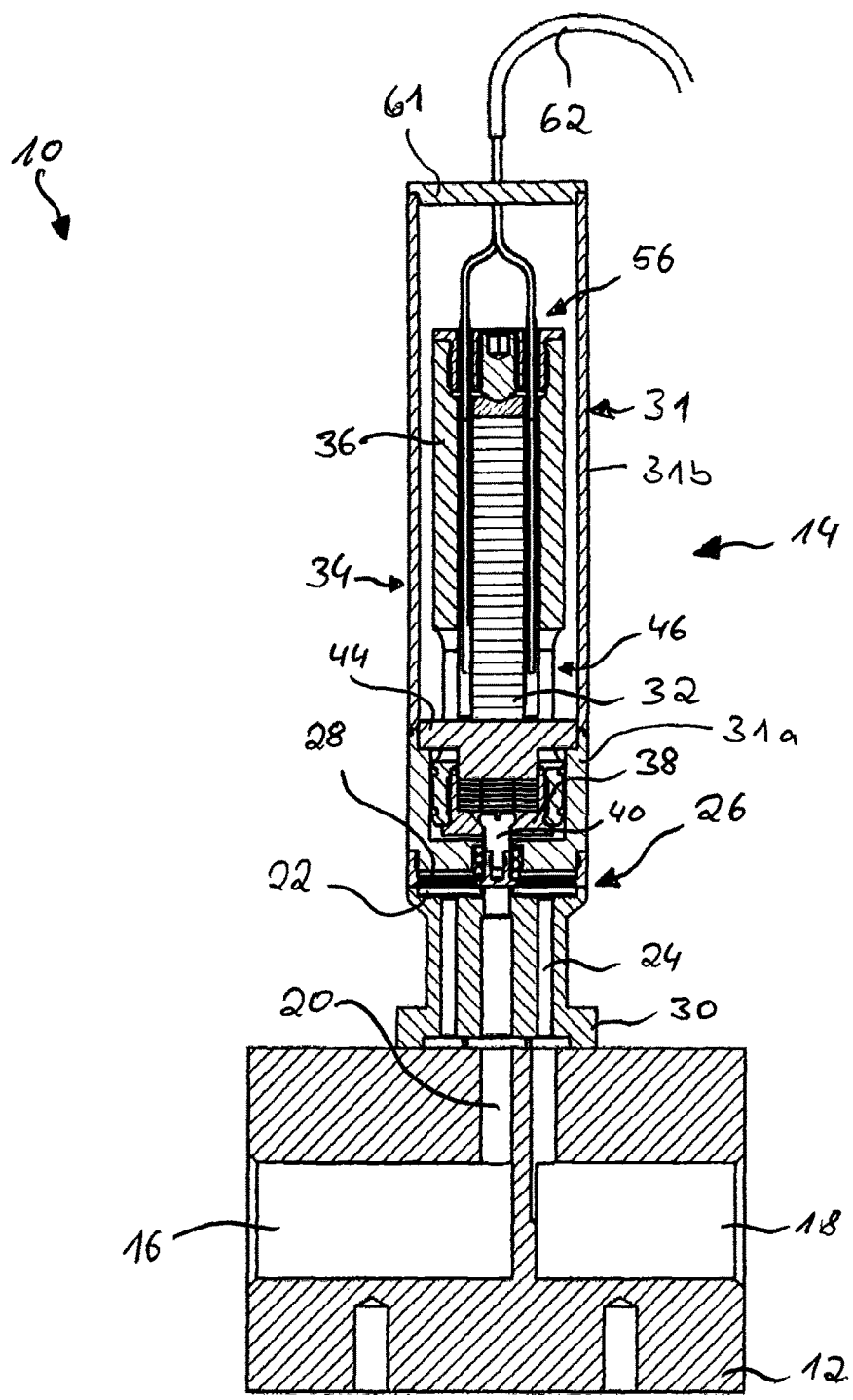
FIG. 2 shows a cross-sectional view of the valve in accordance with the present disclosure shown in FIG. 1.

FIGS. 1 and 2 show a valve 10 used for controlling or regulating fluids. In the illustrated embodiment, the valve 10 is constructed of two parts and comprises a valve body 12 and a linear valve drive 14 which is coupled thereto.

The valve body 12 has a fluid inlet 16, via which a fluid to be controlled or regulated is supplied to the valve 10. Moreover, the valve body 12 has a fluid outlet 18, via which the fluid can exit the valve 10.

Also formed in the valve body 12 is an inflow channel 20 which is in flow communication with the fluid inlet 16. The inflow channel 20 opens into a collecting space 22 which, in turn, is in flow communication with two outflow channels 24 which open into the fluid outlet 18.

The valve body 12 is formed in particular from a rustproof material. In particular, the inner sides of the fluid-carrying channels and spaces are made of a rustproof material.

Moreover, the inflow channel 20 is allocated to a valve seat 26 (see FIG. 3), with which a valve closure element 28 of the linear valve drive 14 cooperates in order to control or regulate the flow through the valve 10, as will be explained hereinafter. Moreover, the valve closure element 28 seals the fluidic part of the valve 10, which is formed in the valve body 12, from the linear valve drive 14. The valve closure element 28 thus constitutes at the same time a sealing barrier and is a diaphragm in the illustrated embodiment.

It is also apparent from FIGS. 1 and 2 that the collecting space 22 and the valve seat 26 are formed in a flange portion 30 which protrudes from the main body of the valve body 12 and to which the linear valve drive 14 is coupled at an axial end.

The linear valve drive 14 has a multi-part drive housing 31 having a cup-shaped lower part 31a and a sleeve-shaped upper part 31b placed thereon. Provided in the drive housing 31 is a piezoelectric actuator 32 which is configured as a stacked actuator and which cooperates with an actuating device 34. The lower part 31a has a base 35 which clamps or merely holds the closure element 28 between itself and the valve body 12. The lower part 31a defines a receiving space together with the upper part 31b, in which the actuator 32 and the actuating device 34 are accommodated.

A change in length of the piezoelectric actuator 32 is transmitted to the valve closure element 28 via the actuating device 34, whereby said valve closure element can be displaced in an axial direction between an open position and a closed position. Accordingly, the actuating device 34 can also be designated as an actuating mechanism.

Moreover, the actuating device 34 comprises a pulling sleeve 36 which is coupled to the piezoelectric actuator 32 via an axial upper end of the piezoelectric actuator 32. This is the axial end of the piezoelectric actuator 32 which faces away from the valve closure element 28 or the valve body 12 and moreover is movable in the drive housing 31. This axial end is also designated as the free end of the piezoelectric actuator 32.

Furthermore, the pulling sleeve 36 has an entrainment element 38 coupled thereto which is likewise part of the actuating device 34. Accordingly, the entrainment element 38 is fixedly coupled to the piezoelectric actuator 32, namely via the pulling sleeve 36.

Alternatively, the pulling sleeve 36 and the entrainment element 38 can also be formed together in one piece so that they form a pulling entrainment sleeve.

Furthermore, the actuating device 34 comprises a pulling piece 40 which is fixedly connected to the valve closure element 28. For example, the pulling piece 40 can have a thread, via which the pulling piece 40 is screwed into the valve closure element 28. The valve closure element 28 correspondingly has an e.g. sleeve-shaped fastening portion 42 which has a corresponding mating thread, in to which the pulling piece 40 engages via its thread.

Furthermore, the actuating device 34 has a bearing element 44 which is seated on a shoulder of the lower part 31a and on which, in turn, the piezoelectric actuator 32 is supported via its end which is directed towards the valve closure element 28. This end can also be designated as a bearing end, fixed end or fixedly mounted end of the piezoelectric actuator 32.

Therefore, the piezoelectric actuator 32 has a fixedly mounted axial end, which is supported on the bearing element 44, and a free axial end which is provided in the drive housing 31 so as to be axially movable and to which the pulling sleeve 36 is fixedly coupled so that the movement of the piezoelectric actuator 32 is transmitted to the pulling sleeve 36.

The bearing element 44 is fixedly mounted on a shoulder of the lower part 31a so that the bearing element 44 is arranged immovably in the drive housing 31.

Figure 3:
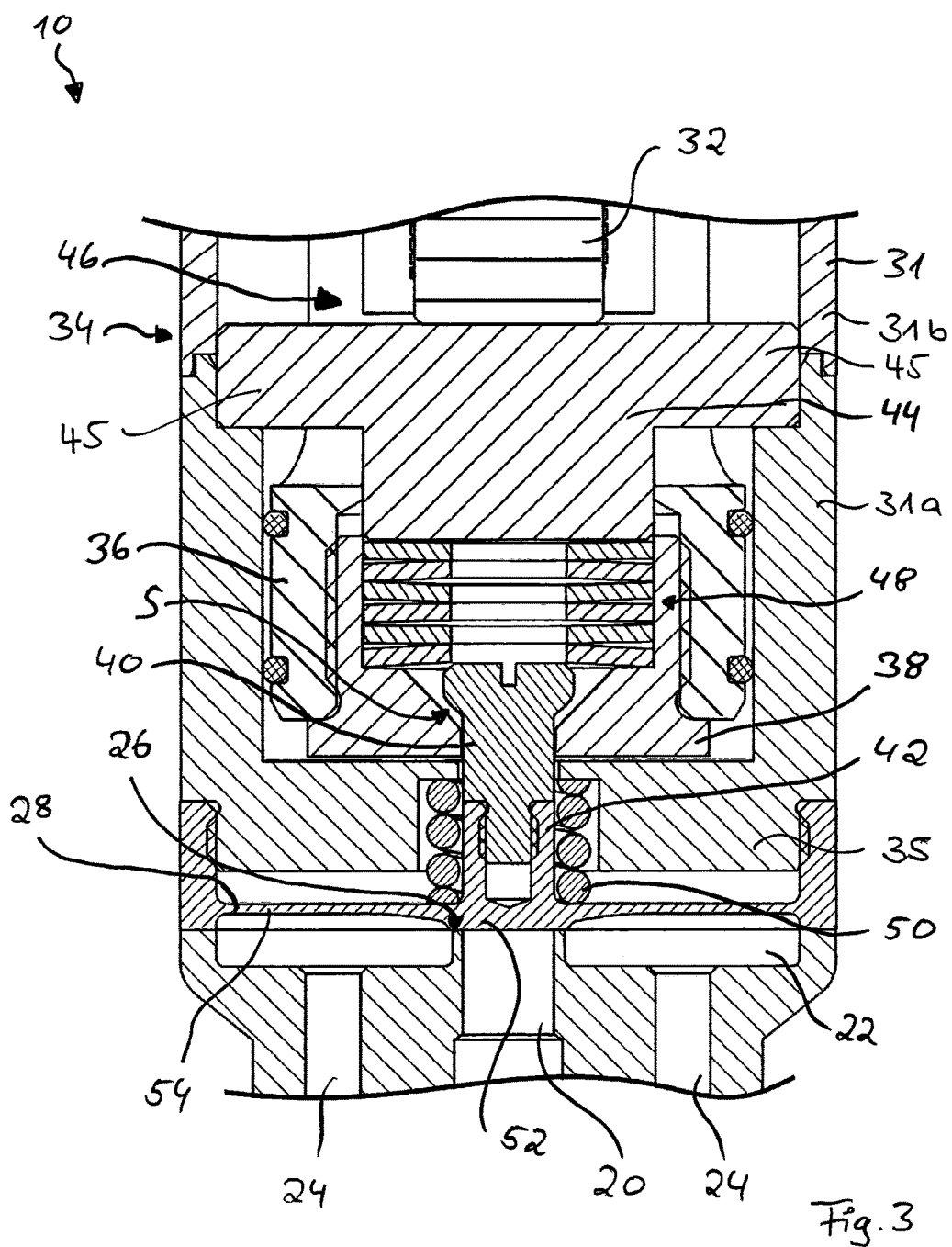
FIG. 3 shows a detailed view of FIG. 2, wherein the linear valve drive is located in the closed position.
Figure 4:
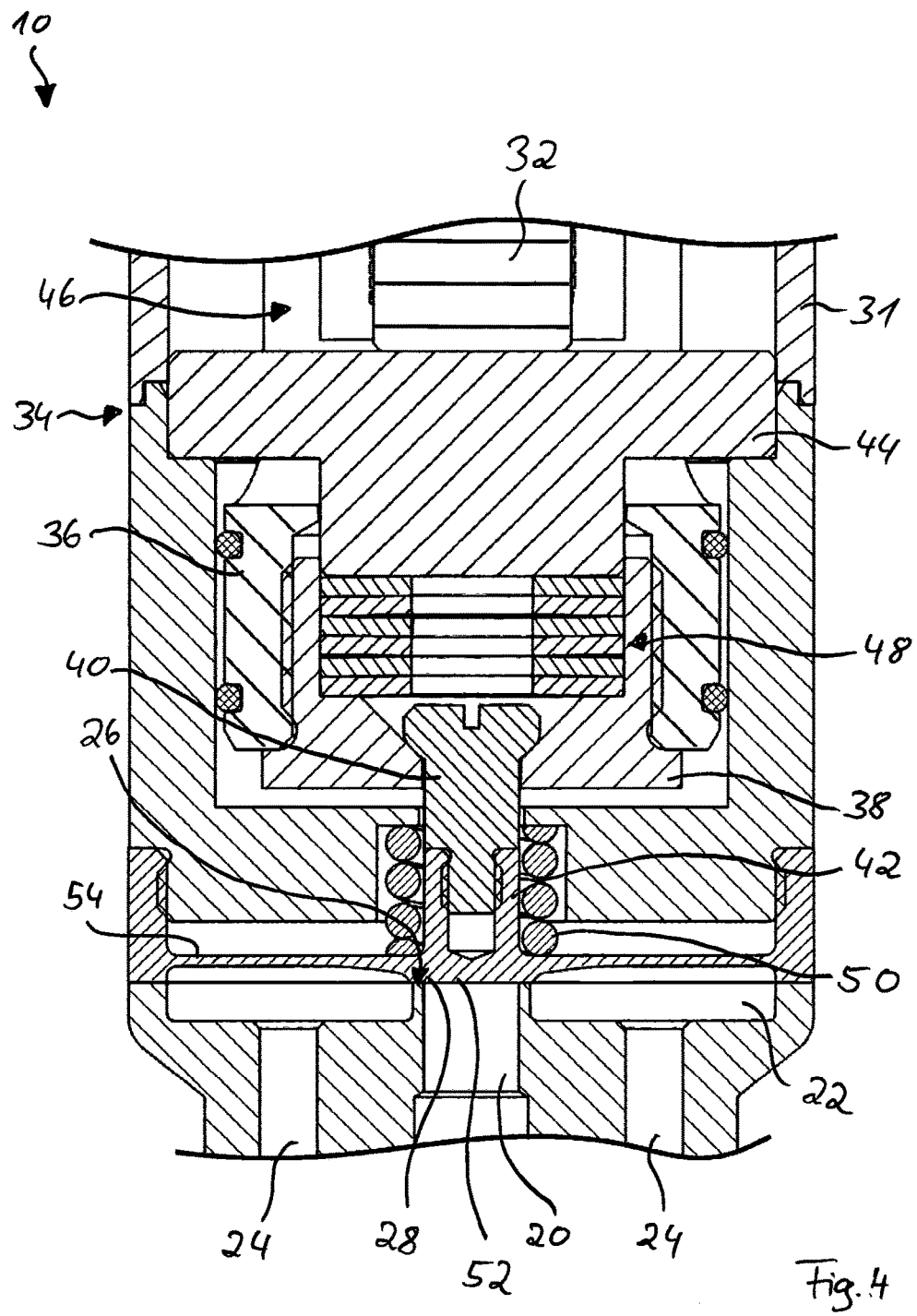
FIG. 4 shows the detail of FIG. 3, wherein the linear valve drive is moved in the direction of the open position.

As is apparent in particular from FIGS. 2 to 4, lateral limbs 45 of the bearing element 44 extend through the pulling sleeve 36 in order to be mounted in the drive housing 31. For this purpose, the pulling sleeve 36 has at least one corresponding aperture 46, preferably two opposing apertures, through which the bearing element 44 having two corresponding limbs 45 engages.

Furthermore, it is apparent from the figures that a spring system 48 (in this case a laminated disk spring) is supported on the bearing element 44 on the side opposite the piezoelectric actuator 32 and presses against the entrainment element 38 and applies force to it accordingly in the direction towards the valve closure element 28. As a result, the piezoelectric actuator 32 is pre-loaded.

The spring force originating from the spring system 48 is transmitted to the piezoelectric actuator 32 via the entrainment element 38 and the pulling sleeve 36 fastened thereto, the free axial end of said actuator being correspondingly urged against the bearing element 44, thus producing the pre-loading in the piezoelectric actuator 32.

In addition to the spring system 48, a closing spring 50 is provided which is supported on the base 35 and urges the valve closure element 28 in the direction of the closed position, i.e. in the direction of the valve seat 26.

Moreover, the valve closure element 28 has, in the extension of the fastening portion 42, a sealing portion 52 which is allocated to the inflow channel 20 or the valve seat 26. The sealing portion 52 is provided on the opposite side of the fastening portion 42 and presses in the closed state against the valve seat 26.

Furthermore, the valve closure element has a diaphragm portion 54 which is allocated to the collecting space 22 and seals said space in the closed position.

Figure 5:
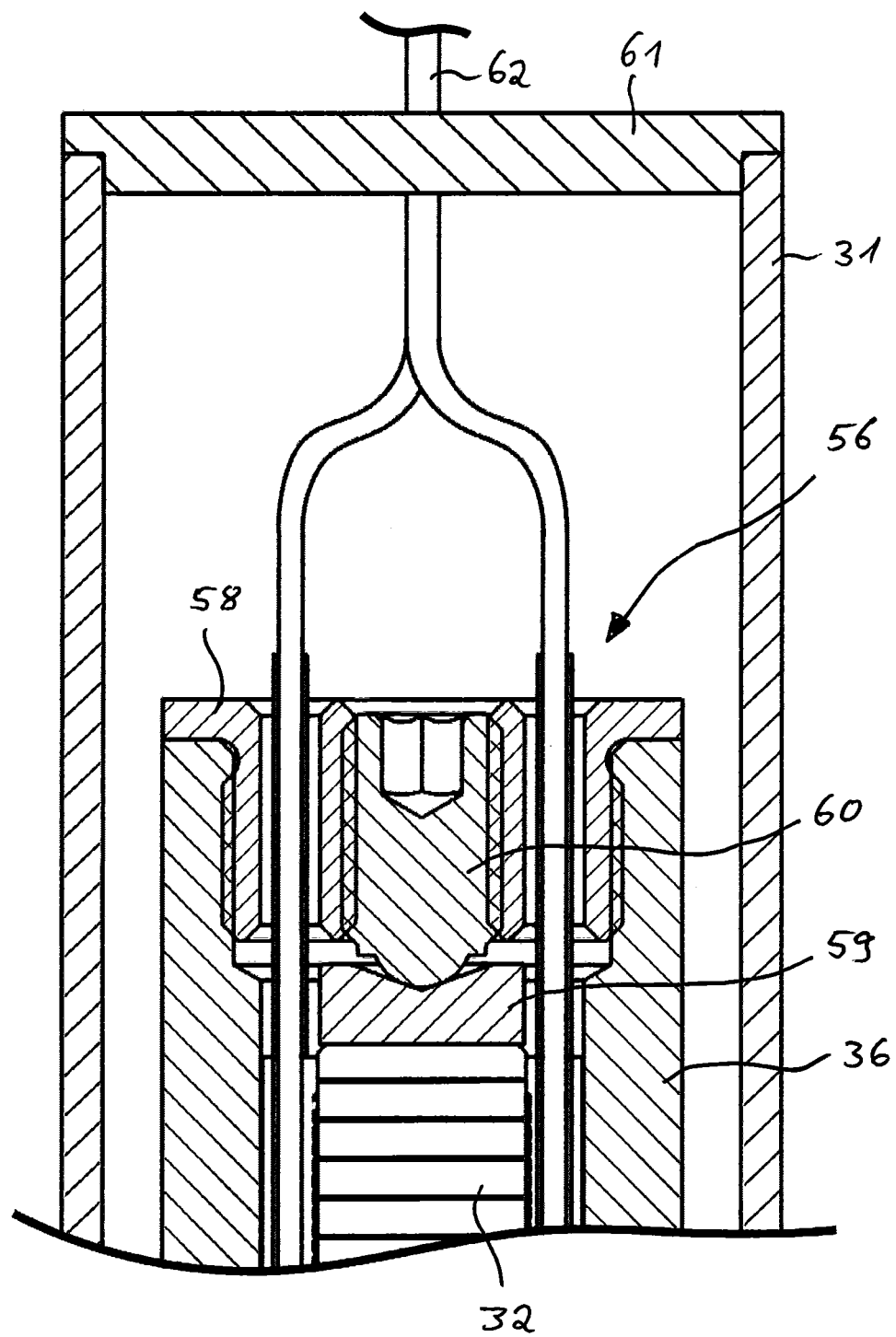
FIG. 5 shows a further detailed view of FIG. 2, showing an adjusting device of the linear valve drive.

It is also apparent from FIGS. 2 and 5 that the linear valve drive 14 comprises an adjusting device 56, by means of which the relative position of the pulling sleeve 36 with respect to the piezoelectric drive 32 can be adjusted. The adjusting device 56 comprises a holding element 58 which is coupled (screwed) to the pulling sleeve 36. A central internal thread of the holding element 58 has an adjusting screw 60 screwed therein which presses against a bearing part 59 lying on the upper end of the actuator 32. A central recess on the bearing part 59 centers the bearing part with respect to the convex end of the adjusting screw 60.

Accordingly, the pulling sleeve 36 is part of both the adjusting device 56 and the actuating device 34 at the same time. In a similar manner, both the holding element 58 and the adjusting screw 60 are also part of the adjusting device 56 and part of the actuating device 34 at the same time because the force originating from the piezoelectric drive 32 is transmitted to the adjusting device 56 and the pulling sleeve 36 connected thereto.

This is apparent from the mode of operation of the valve 10 and the function of the adjusting device 56 which will be explained hereinafter. To this end, reference is made in particular to FIGS. 3 to 5.

The valve 10 is a normally closed valve, i.e. an NC valve. This means that the valve closure element 28 is located in its closed position when no voltage is applied to the piezoelectric actuator 32. This closed position is shown in FIG. 3.

It is particularly apparent from the closed position shown in FIG. 3 that there is an axial clearance S present between the entrainment element 38 and the pulling piece 40. Therefore, the entrainment element 38 and the pulling piece 40 are not rigidly connected together.

In the closed position, the piezoelectric actuator 32 is located in its initial position, for which reason the pulling sleeve 36 is in its lowest position, as seen in the axial direction. Accordingly, the entrainment element 38 which is coupled to the pulling sleeve 36 is located in its lowest position, as seen axially, thus producing the corresponding clearance S between the entrainment element 38 and the pulling piece 40. The pulling piece 40 cannot be lower, as seen axially, because the valve closure element 28 which is coupled to the pulling piece 40 lies on the valve seat 26.

If the linear valve drive 14 is displaced from the position shown in FIG. 3 to the open position, the piezoelectric actuator 32 expands with its free end in the opposite direction to the valve closure element 28, i.e. with the end to which the pulling sleeve 36 is fastened.

In this case, the pulling sleeve 36 is moved by the piezoelectric actuator 32 away from the valve closure element 28 so that a pulling force is exerted upon the entrainment element 38 by the pulling sleeve 36. The entrainment element 38 likewise moves accordingly away from the valve closure element 28, thus initially reducing the clearance S provided between the entrainment element 38 and the pulling piece 40 until the entrainment element 38 abuts the pulling piece 40, as shown in FIG. 4. This produces, at least in the axial direction, a form fit between the entrainment element 38 and the pulling piece 40.

The clearance S provided between the entrainment element 38 and the pulling piece 40 thus corresponds to a small idle stroke of the linear valve drive 14 because the axial movement which is produced by the linear valve drive 14, in particular the piezoelectric actuator 32, in order to close the clearance S does not have any influence upon the valve closure element 28. Said valve closure element still remains in its closed position.

However, from the point the entrainment element 38 contacts the pulling piece 40, the entrainment element 38 transmits a force to the pulling piece 40 if the piezoelectric actuator 32 expands further, whereby the pulling piece 40 pulls on the valve closure element 28 so that the valve closure element 28 is pulled from the valve seat 26, in particular in the region of the sealing portion 52.

The valve 10 then opens accordingly, permitting a flow of fluid between the inflow channel 20 and the outflow channel 24 or between the fluid inlet 16 and the fluid outlet 18.

The force originating from the piezoelectric actuator 32 is correspondingly greater than the spring force of the closing spring 50 and the spring force of the spring system 40 so that the valve closure element 28 can be displaced against the spring forces of the spring system 48 and the closing spring 50.

A complicated reversal of direction of the force originating from the piezoelectric actuator 32 thus does not take place in the actuating device 34 because the pulling sleeve 36, the entrainment element 38 and the pulling piece 40 are all moved in the same direction if the valve 10 is to be opened.

In order to move the valve 10 from its open position to the closed position, the current supplied to the piezoelectric actuator 32 is simply switched off or the previously applied voltage is no longer applied. As a result, the piezoelectric actuator 32 returns to its initial position in terms of valve control technology. The spring force of the closing spring 50 urges the valve closure element 28 onto the valve seat 26. It is clearly apparent from this that the valve 10 is a normally closing valve.

If the clearance S between the entrainment element 38 and the pulling piece 40 is too small or too large, which can occur by reason of changes in length in the actuating mechanism caused by temperature or service life, the corresponding clearance S and thus the idle stroke of the linear valve drive 14 can be adjusted by the adjusting device 56. A certain idle stroke is therefore also required because all of the parts which are coupled in series are subject to production tolerances and the pulling element 40 must not be allowed to abut against the entrainment element 38 too early and the closure element 28 must not be prevented from reaching the valve seat.

In order to adjust the clearance S, the screw element 58 of the adjusting device 56 is actuated, in particular manually, whereby the relative position of the pulling sleeve 36 changes with respect to the piezoelectric actuator 32, in particular with respect to the free axial end of the piezoelectric actuator 32.

As a result, the pulling sleeve 36 is displaced axially in relation to the piezoelectric actuator 32, whereby the entrainment element 38 which is coupled to the pulling sleeve 36 is likewise displaced axially. The clearance S between the entrainment element 38 and the pulling piece 40 changes accordingly because the pulling piece 40 is not fixedly coupled to the entrainment element 38.

The adjusting device 56 can be easily accessed via the drive housing 31 because the drive housing 31 comprises e.g. a lid element 61 which can be removed from the rest of the drive housing 31.

The electric cables 62 required to electrically activate the piezoelectric actuator 32 can likewise be guided easily through the lid element 61.

After the linear valve drive 14 has been coupled to the valve body 12, the flange portion 30 and the lateral walls of the valve closure element 28 can be, in particular, welded together in order to hermetically seal the valve 10.

The clearance S or the idle stroke can be adjusted in particular merely once during assembly of the valve 10; e.g. when the valve body 12 is coupled to the linear valve drive 14.

In general, a linear valve drive 14 and a normally closing valve 10 is thus provided which is constructed in a simple manner and still provides the possibility of adjusting the clearance S present in the actuating device 34 in order to react to, or compensate for, temperature-induced or service life-induced changes or production-induced tolerances.

What is claimed:

1. A linear valve drive for connection to a valve body which has a valve seat, comprising a drive housing, a valve closure element, an entrainment element, a piezoelectric actuator having a free end facing away from the valve closure element, which piezoelectric actuator is arranged within said drive housing, and an adjusting device comprising a pulling sleeve coupled to a holding element at one end and the entrainment element at another end, wherein the holding element presses against a bearing part at the free end of the piezoelectric actuator, which adjusting device is configured such that a length of an idle stroke of said linear valve drive is adjustable by actuation of the adjusting device to change axial positioning of the pulling sleeve relative to the piezoelectric actuator, said valve closure element being displaceable in an axial direction between an open position and a closed position by means of said piezoelectric actuator and an interposed actuating device, said piezoelectric actuator being supported on said actuating device via its side directed towards said valve closure element.

2. The linear valve drive as claimed in claim 1, wherein said actuating device comprises an entrainment element and a pulling piece.

3. The linear valve drive as claimed in claim 2, wherein a clearance between said entrainment element and said pulling piece is adjustable by said adjusting device, said clearance corresponding to said idle stroke.

4. The linear valve drive as claimed in claim 1, wherein said adjusting device comprises an axially displaceable pulling sleeve which at least partially surrounds said piezoelectric actuator and which is part of said actuating device.

5. The linear valve drive as claimed in claim 4, wherein said pulling sleeve is fixedly coupled to said entrainment element of said actuating device.

6. The linear valve drive as claimed in claim 1, wherein said actuating device has a bearing element which is directly coupled to said piezoelectric actuator and on which said piezoelectric actuator is supported.

7. The linear valve drive as claimed in claim 6, wherein said bearing element is fixedly mounted in said drive housing.

8. The linear valve drive as claimed in claim 5, wherein said pulling sleeve has at least one aperture, through which said bearing element extends.

9. The linear valve drive as claimed in claim 1, wherein said actuating device comprises a spring system, by means of which said piezoelectric actuator is pre-loaded.

10. The linear valve drive as claimed in claim 9, wherein said spring system is supported with one side on said bearing element.

11. The linear valve drive as claimed in claim 10, wherein said spring system is supported on the side of said bearing element opposite the piezoelectric actuator.

12. The linear valve drive as claimed in claim 1, wherein a closing spring is provided which is supported on said drive housing and urges said valve closure element away from said piezoelectric actuator.

13. The linear valve drive as claimed in claim 1, wherein said piezoelectric actuator does not transmit any force to said valve closure element in said closed position.

14. The linear valve drive as claimed in claim 1, wherein said valve closure element comprises a sealing portion and a diaphragm portion.

15. The linear valve drive as claimed in claim 14, wherein said sealing portion and said diaphragm portion are formed together in one piece.

16. A valve comprising a linear valve drive as claimed in claim 1.

17. The valve as claimed in claim 16, wherein said valve is a normally closed valve.

18. The valve as claimed in claim 16, wherein said valve body comprises at least one of at least one inflow channel, at least one outflow channel and at least one collecting space.

19. The linear valve drive as claimed in claim 7, wherein said pulling sleeve has at least one aperture, through which said bearing element extends.

20. A linear valve drive for connection to a valve body which has a valve seat, comprising a drive housing, a valve closure element, and a piezoelectric actuator which is arranged within said drive housing, said valve closure element being displaceable in an axial direction between an open position and a closed position by means of said piezoelectric actuator and an interposed actuating device, said piezoelectric actuator being supported on said actuating device via its side directed towards said valve closure element, said linear valve drive comprising an adjusting device which is configured such that an idle stroke of said linear valve drive is intentionally introduced and variably adjustable.

* * * * *